(12) United States Patent
Ohbayashi et al.

(10) Patent No.: US 6,767,137 B2
(45) Date of Patent: Jul. 27, 2004

(54) OPTICAL CONNECTOR AND OPTICAL ELEMENT

(75) Inventors: Yoshiaki Ohbayashi, Nara (JP); Keiji Mine, Yao (JP); Hiroshi Nakagawa, Kyoto (JP)

(73) Assignee: Hosiden Corporation, Yao (JP)

( * ) Notice: Subject to any disclaimer, the term of this patent is extended or adjusted under 35 U.S.C. 154(b) by 12 days.

(21) Appl. No.: 10/212,766

(22) Filed: Aug. 7, 2002

(65) Prior Publication Data

US 2003/0031424 A1 Feb. 13, 2003

(30) Foreign Application Priority Data

Aug. 8, 2001 (JP) ......................................... 2001-240462
Jan. 9, 2002 (JP) ......................................... 2002-001912

(51) Int. Cl.[7] ................................................ G02B 6/38
(52) U.S. Cl. .......................................... 385/75; 439/577
(58) Field of Search ............................... 385/75, 74, 88; 439/577

(56) References Cited

U.S. PATENT DOCUMENTS

| | | | | |
|---|---|---|---|---|
| 6,213,651 B1 | * | 4/2001 | Jiang et al. ................... | 385/92 |
| 6,383,835 B1 | * | 5/2002 | Hata et al. ..................... | 438/65 |
| 6,388,535 B1 | * | 5/2002 | Otsuki et al. ............ | 331/177 R |
| 6,499,890 B2 | * | 12/2002 | Gilliland et al. .............. | 385/88 |
| 6,522,798 B2 | * | 2/2003 | Chiappetta et al. ........... | 385/14 |
| 6,530,699 B1 | * | 3/2003 | Gilliland et al. .............. | 385/88 |

\* cited by examiner

*Primary Examiner*—Hae Moon Hyeon
(74) *Attorney, Agent, or Firm*—Armstrong, Kratz, Quintos, Hanson & Brooks, LLP

(57) ABSTRACT

To enable soldering with high efficiency, high temperature and short time or reflow soldering without using baking or moisture-proof packaging.

An optical device which is placed at a side of distal end of plug inserted into a body is mounted on a surface of printed wiring board, and connected via the printed wiring board to a main substrate to which an optical connector is mounted. The printed wiring board is formed of the same material as a transparent resin package of the optical device. The printed wiring board is inserted into the body from the upper surface side opposite to the surface to which the optical connector is mounted, and fixed thereto. Alternatively, the printed wiring board is inserted into the body from the rear surface side opposite to the side at which the plug is inserted, and fixed thereto.

11 Claims, 16 Drawing Sheets

OPTICAL CONNECTOR AND OPTICAL ELEMENT

BACKGROUND OF THE INVENTION

1. Field of the Invention

The present invention relates to an optical connector that is used to input/output an optical signal in various types of digital equipments including a DVD, an MD, a CD, an amplifier, a TV, an STB (set-top box: an adapter device for satellite broadcasting) and a personal computer and the like, and an optical element used for the optical connector. More particularly, the present invention relates to an optical connector whose jack side into which a plug is inserted is improved, and an optical element used for the optical connector.

2. Description of the Related Art

A box-shaped optical connector has been conventionally used for stationary digital audio equipment. A compact connector which is referred to as an optical mini jack and used for circular mini plug is widely used for a portable type digital audio equipment. The optical connector is disclosed in, e.g., Japanese Unexamined Patent Publication No. 11-109189. A structure of the optical connector disclosed in Japanese Unexamined Patent Publication No. 11-109189 will be described with reference to FIG. 16.

The optical connector disclosed in Japanese Unexamined Patent Publication No. 11-109189 comprises a jack type body 1 into which a circular mini plug is inserted and contact piece members 3a through 3e mounted to the body 1. A plug insertion hole 2 into which a plug is inserted is formed at a front surface of the body 1. The contact piece members 3a through 3e elastically contact the plug inserted into the plug insertion hole 2 of the body 1 from opposite sides. At the same time, parts of them protrude from the opposite sides of the body 1 as connecting terminals and are electrically connected to a main substrate on which the body 1 is mounted, so that transmission of electric signals is performed. An optical device 4 is built in a back end portion of the body 2 so as to oppose the mini plug inserted into the plug insertion hole 2.

The optical device 4 disclosed herein has a structure that a chip mounted to a lead frame is sealed, together with a part of the lead frame, within a transparent resin package 4a. The other portion of the lead frame protrudes, as a connecting terminal 4b for the main substrate, from the transparent resin package 4a, and is extended backward from the body 1 in a state that the optical device 4 is incorporated into body 1.

Such conventional optical connector has the following problems mainly about the structure of the optical device 4.

When the optical connector is mounted to the main substrate, the connecting terminal 4b of the optical device 4 is soldered together with the contact piece members 3a through 3e to the main substrate. At this time, a coefficient of thermal expansion of the transparent resin package 4a of the optical device 4 is significantly different from that of the connecting terminal 4b (lead frame). Thus, there is a danger that cracks or peeling may occur in the transparent resin package 4a. In the worst case, there is a danger that a lead wire connecting the chip to the lead frame is broken.

For this reason, soldering with high efficiency, high temperature and short time or reflow soldering is impossible as a soldering step. Even if such soldering is possible, baking or moisture-proof packaging that is one of moisture removal treatments for the transparent resin package 4a is required, resulting in an increase in steps.

Further, the connecting terminal 4b of the optical device 4 protrudes backward from the body 1. This causes an increase in mounting area.

Moreover, in accordance with this optical connector, an external force is applied to the body 1 and the optical device 4 when the plug is inserted or removed. An external force generated by the plug inserted into the body 1 being wrenched is also applied. Thus, high soldering strength relative to the main substrate is required for the optical device 4 as well as the body 1.

SUMMARY OF THE INVENTION

The present invention was developed in light of such circumstances, and an object of the present invention is to provide an optical connector which enables soldering with high efficiency, high temperature and short time or reflow soldering without using baking or moisture-proof packaging, and a reduction in mounting area.

Another object of the present invention is to provide an optical element for optical connector which enables the soldering with high efficiency, high temperature and short time or the reflow soldering without using the baking or the moisture-proof packaging, and a reduction in mounting area.

Yet another object of the present invention is to provide an optical element for optical connector which can ensure sufficient soldering strength for insertion/removal of plug or wrench thereof.

In order to accomplish aforementioned objects, the optical connector of the present invention is characterized in that an optical connector comprising: a body into which a plug is inserted; and an optical device which is disposed within the body so as to be placed at a side of the distal end of the plug inserted into the body, wherein the optical device is mounted to a surface of a printed wiring board which is placed within the body so as to make substantially a right angle, and is connected via the printed wiring board to a main substrate to which the optical connector is mounted.

The optical element for optical connector relating to the present invention is an optical element for optical connector which is mounted to a body into which a plug is inserted, comprising: a printed wiring board which is placed within the body so as to make substantially a right angle and in which wiring patterns are provided at a lower end surface thereof such that the lower end surface is soldered to a main substrate in a state of the optical connector being mounted to the main substrate; and an optical device which is mounted to a front surface of the printed wiring board so as to be disposed at the side of the distal end of plug inserted into the body.

In accordance with the optical connector of the present invention, the optical device is connected to the main substrate by directly soldering wiring patterns of the printed wiring board to which the optical device is mounted to the main substrate. Namely, the optical device is mounted to the main substrate without using a lead frame. Since the printed wiring board is made of resin, a difference of coefficient of thermal expansion between the transparent resin package of the optical device and the printed wiring board is much smaller than a difference of coefficient of thermal expansion between the transparent resin package and the lead frame. For this reason, there is little danger that cracking or peeling occurs at the transparent resin package. As a result, soldering with high efficiency, high temperature and short time or reflow soldering is possible. The printed wiring board needs not to be protruded from the body for connection to the main substrate as the lead frame. Consequently, a reduction in mounting area is possible.

If the printed wiring board is made of the same material as the transparent resin package of the optical device, cracking or peeling of the transparent resin package is particularly effectively prevented.

As the structure for fixing the printed wiring board, a structure that the printed wiring board is inserted into the body from the rear surface side opposite to the side into which plug is inserted and fixed thereto, or a structure that the printed wiring board is inserted into the body from the upper surface side opposite to the surface to which the optical connector is mounted is preferable. In accordance with such fixing structures, the optical device mounted on the surface of the printed wiring board is shielded by a part of the body at the side at which the optical connector is mounted. Thus, it is possible to prevent a flux from attaching to the transparent resin package of the optical device, which is a problematic matter when soldering the optical connector by the reflow soldering.

In a case of the fixing structure in which the printed wiring board is inserted into the body from the lower surface side which is the surface to which the optical connector is mounted, the optical device is exposed at the lower surface side by an insertion hole formed at the lower surface. At a time of the reflow soldering, flux vapor directly contacts the transparent resin package. As a result, the flux attaches to the surface of the transparent resin package, and a transparency thereof is decreased.

In accordance with the optical element for the optical connector, the optical device is mounted to the front surface of the printed wiring board which is disposed within the body of the optical connector so as to make substantially a right angle and wiring patterns provided at the lower end surface of the printed, wiring board are soldered to the main substrate to which the optical connector is mounted, thereby the optical device is connected to the main substrate. Consequently, the above-described functions can be obtained. Nevertheless, as the printed wiring board is vertically mounted on the main substrate in an inverted T-shape, there arises a problem in that the printed wiring board is easily peeled from the main substrate relative to a rotational moment when the plug inserted into the body is wrenched, in particular, a rotational moment within a plane parallel to the main substrate.

For such problem, it is effective to provide dummy patterns for mounting strength enhancement at the lower end surface of the printed wiring board, especially, at the opposite side end portions thereof. In this way, as well as the soldered area is increased, the soldered portions are disposed at the opposite side end portions of the lower end surface of the printed wiring board. Thus, it effectively acts for the rotational moment within a plane parallel to the main substrate.

Preferably, the wiring patterns and the dummy patterns provided at the lower end surface of the printed wiring board are continuously formed so as to be exposed from the lower end surface of the printed wiring board to at least one of the front surface and the rear surface thereof. Because of such structure, the soldered area is increased, and the mounting strength for the main substrate is also increased.

The printed wiring board preferably has first through-holes which pass through the printed wiring board in a plate thickness direction at positions corresponding to the wiring patterns of the lower end surface and second through-holes which pass through the printed wiring board in a plate thickness direction at positions corresponding to the dummy patterns of the lower end surface. Because of such structure, the mounting strength for the main substrate is even further increased.

The first through-hole is preferably a concave portion with its cross-section being formed in a substantial semi-circular shape. The second through-hole is preferably a concave portion formed from the lower end surface of the printed wiring board to the side surface thereof with its cross-section being formed in a substantial quarter of circle.

BRIEF DESCRIPTION OF THE DRAWINGS

FIG. 1 shows four views of an optical connector relating to a first embodiment of the present invention.

FIG. 1(b) shows a front view and FIG. 1(c) shows a side view.

DESCRIPTION OF THE PREFERRED EMBODIMENTS

Figure 1D:
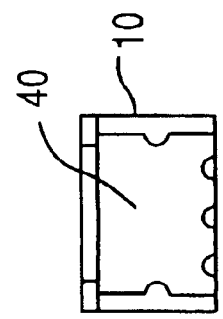
FIG. 1(c) shows a side view and FIG. 1(d) shows a rear view.
Figure 1A:
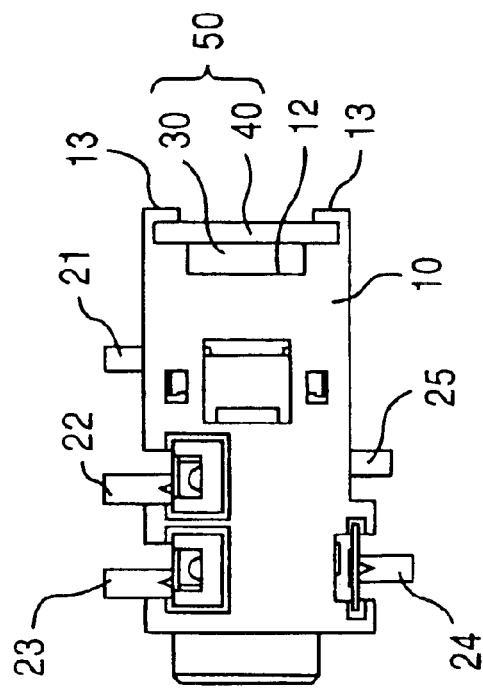
FIG. 1(a) shows a plan view.
Figure 1C:
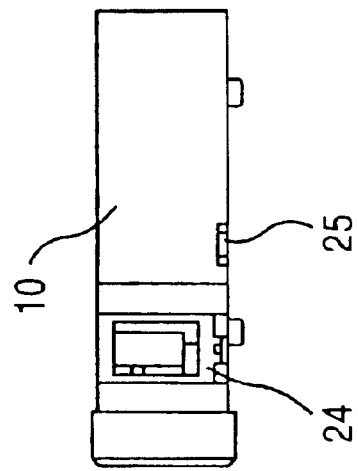
Figure 1B:
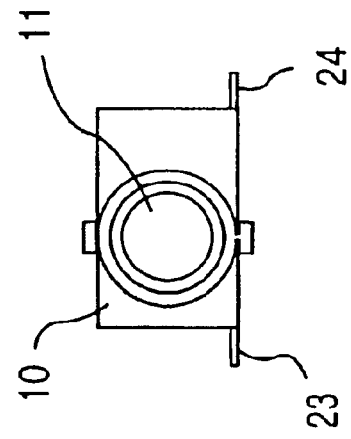
FIG. 1(b) shows a front view.
Figure 2A:
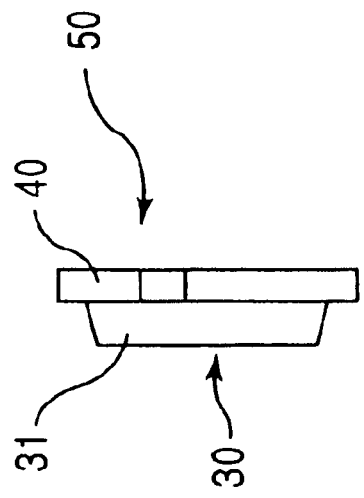
FIG. 2 shows four views of optical device and printed wiring board used for the optical connector.
Figure 2C:
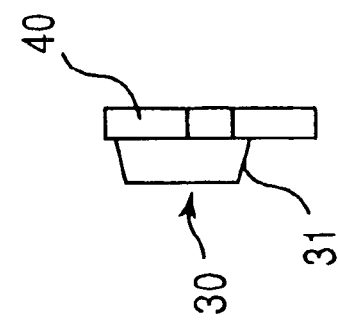
Figure 2D:
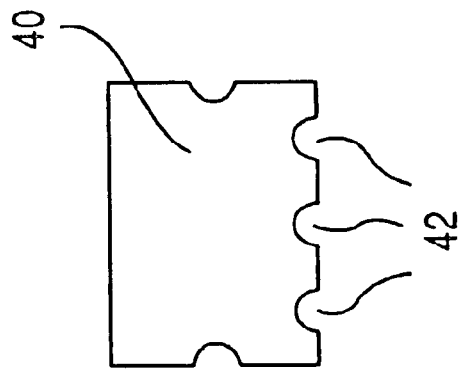
Figure 2B:
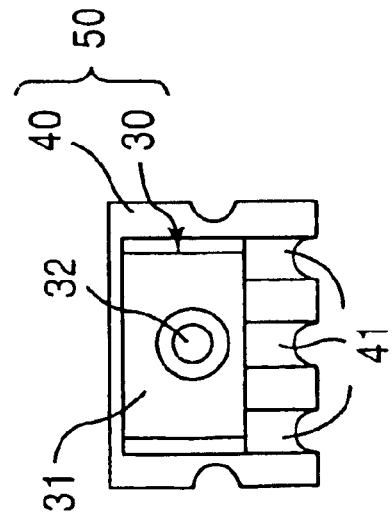
Figure 3:
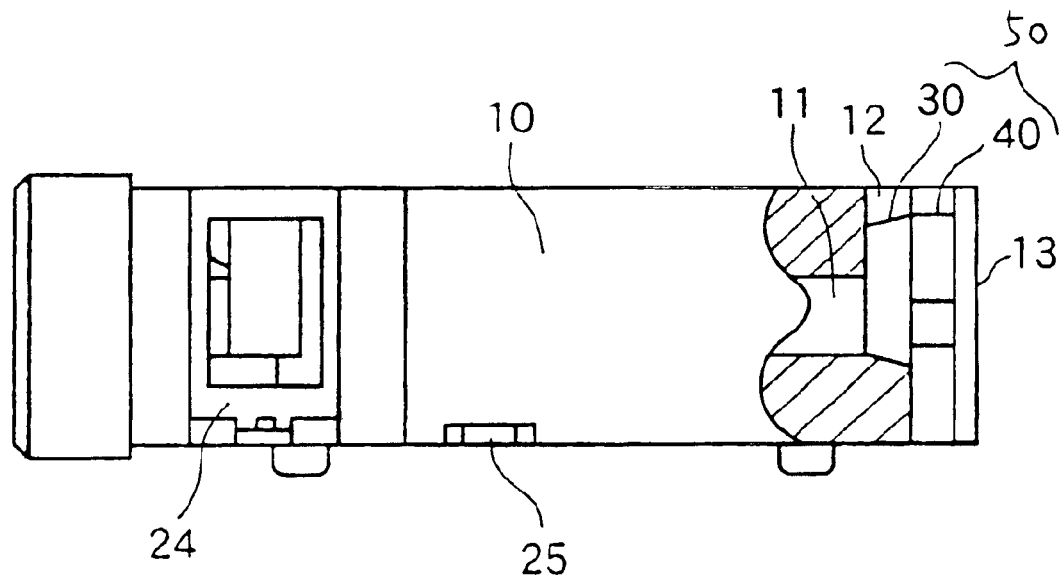
FIG. 3 is a partially-broken side view of the optical connector.
Figure 4:
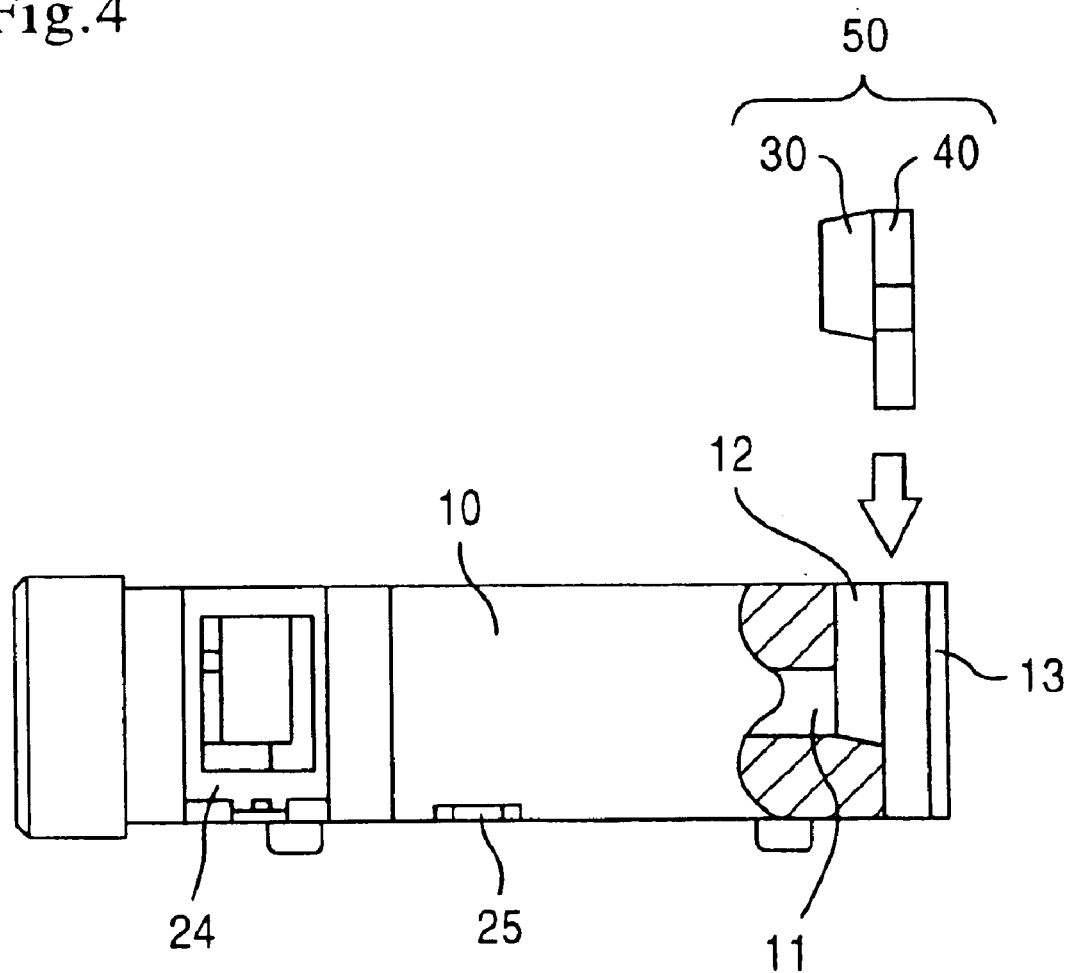
FIG. 4 is a partially-broken side view showing a direction that the optical device and the printed wiring board of the optical connector are inserted.

Embodiments of the present invention will be described hereinafter on a basis of the drawings. Four views of an optical connector relating to a first embodiment of the present invention are shown in FIG. 1. Four views of an optical device and a printed wiring board used in the optical connector are shown in FIG. 2. FIG. 3 is a partially-broken side view of the optical connector. FIG. 4 is a partially-broken side view showing a direction that the optical device and the printed wiring board in the optical connector are inserted.

The optical connector relating to the first embodiment of the present invention is a compact connector for a circular mini plug which is widely used in portable type digital audio equipment, or the like, and referred to as an optical mini jack. The optical connector is mounted on a main substrate (not shown). The optical connector comprises, as shown in FIG. 1, a jack type body 10 into which the circular mini plug is inserted, five contact piece members 21 through 25 mounted to the body 10 and an optical device 30 which is incorporated together with a printed wiring board 40 into a back end portion of the body 10.

The box-shaped body 10 made of resin has a plug insertion hole 11 which is extended from a front surface of the body to the back end portion thereof and has a circular cross-section, and a device accommodating hole 12 which is provided at the back end portion of the body 10 in order to accommodate the optical device 30 and the printed wiring board 40. The plug insertion hole 11 communicates with the device accommodating hole 12. As shown in FIGS. 3 and 4, the device accommodating hole 12 is provided at an upper surface of the back end portion of the body 10, and a bottom portion thereof is closed by a portion of the optical device 30. A portion of the device accommodating hole 12 that the printed wiring board 40 is placed is open downward for connection to the main substrate. On the other hand, a back portion of the device accommodating hole 12 is open except for supporting portions 13, 13 disposed on the opposite sides.

Five contact piece members 21 through 25 are formed of elastic metallic thin plate. Parts of the respective contact piece members elastically abut, within the body 10, the plug inserted into the plug insertion hole 11 from its sides. The other parts of the contact piece members protrude from the opposite sides of the body 10 as connecting terminals. A detailed structure of the contact piece members 21 through 25 is the same as that of five contact piece members disclosed in Japanese Unexamined Patent Publication No. 11-109189.

As shown in FIG. 2, the optical device 30 is bonded to a front surface of the vertical printed wiring board 40 which is inserted into the back end portion of the body at a right angle, so that an optical element 50 (see FIG. 1) is structured.

The optical device 30 of the optical element 50 has a structure that a chip is sealed in a transparent resin package 31, and is fixed within the body 10 together with the printed wiring board 40 such that a distal end of the plug inserted into the plug insertion hole 11 opposes the chip. A lens 32 that the distal end portion of the plug inserted into the plug insertion hole 11 opposes is provided at a front surface of the transparent resin package 31 so as to be placed at the front surface side of the chip.

The printed wiring board 40 is made of transparent resin (e.g., epoxy resin) which is the same as the transparent resin package 31 of the optical device 30. Wiring patterns 41 are printed in a vertical direction on the front surface of the printed wiring board 40. One end portion of each of the wiring patterns 41 is connected to the chip within the transparent resin package 31. The other end portion of the wiring pattern 41 is extended to a lower end surface of the printed wiring board 40 for connection to the main substrate.

The lower end surface of the printed wiring board 40 is substantially flush with a lower surface of the body 10 and exposed downward. A plurality of through-holes 42 corresponding to the wiring patterns 41 are formed at a portion of the lower end surface of the printed wiring board 40 except for opposite side end portions. Each of the through-holes 42 passes through the printed wiring board 40 in a plate thickness direction and is formed in a concave portion with a semi-circular shaped cross-section, and its lower surface being open downward.

The optical device 30 and the printed wiring board 40 are fixed to the body 10 by press fit, adhesive and the like.

Next, a function of the optical connector relating to the first embodiment of the present invention will be described.

The optical connector is mounted on a main substrate by, for example, reflow soldering. Thus, the contact piece members 21 through 25 are electrically connected to the surface of the main substrate and mechanically fixed thereto. The optical device 30 of the optical element 50 is electrically connected via the printed wiring board 40 to the main substrate.

In a case of the reflow soldering, the entire optical connector is heated at high temperature within a reflow furnace. The transparent resin package 31 of the optical device 30 is made of the same resin as the printed wiring board 40, and thus there is not a difference in a coefficient of thermal expansion between them. For this reason, cracking or peeling does not occur at the transparent resin package 31. Namely, the reflow soldering is possible without performing baking or moisture-proof packaging.

At the time of the soldering, flux vapor is generated from the surface of the main substrate. Nevertheless, the optical device 30 is inserted into the device accommodating hole 12 provided at the back end portion of the body 10 from upward, and the opposite sides and the lower portion thereof are shielded by a part of the body 10. Thus, it is possible to prevent the flux from attaching to the surface of the transparent resin package 31 of the optical device 30.

The printed wiring board 40 which is accommodated within the back end portion of the body 10 at a right angle is not protruded from the body 10 as the lead frame but is bonded to the surface of the main substrate at its lower end surface by reflow soldering, so that a reduction in mounting area is possible.

Figure 5:
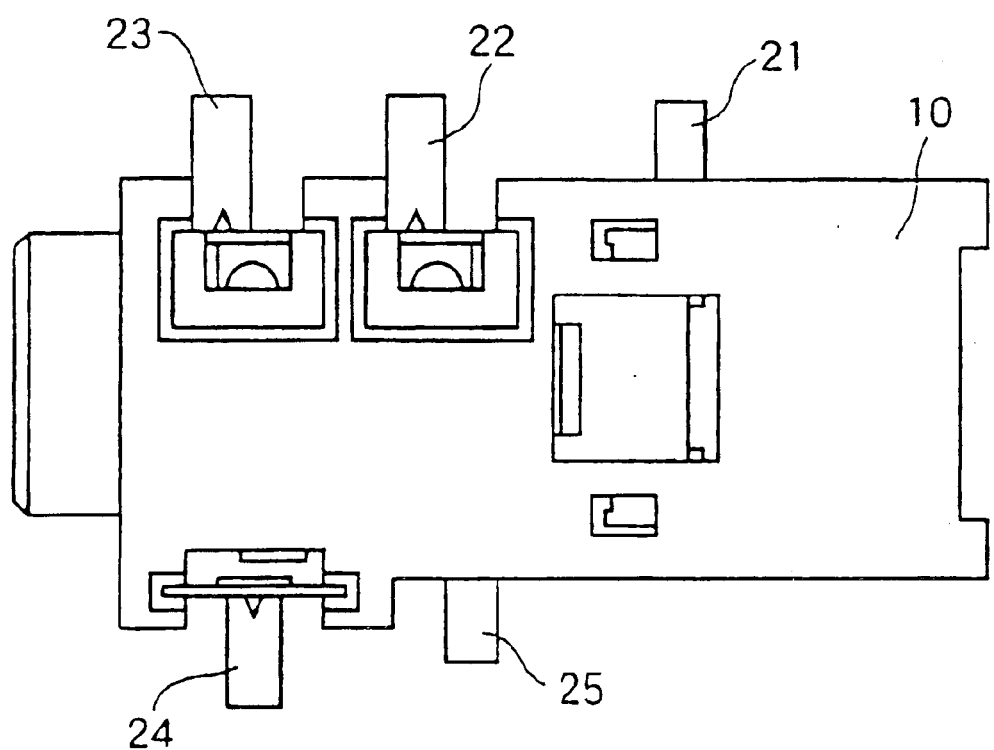
FIG. 5 is a plan view of the optical connector relating to a second embodiment of the present invention.
Figure 6:
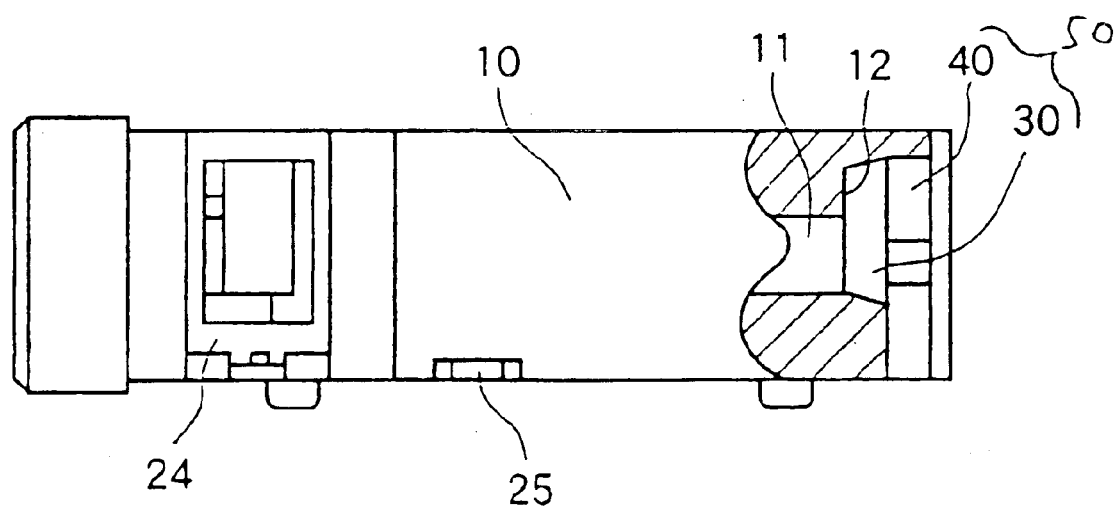
FIG. 6 is a partially-broken side view of the optical connector.
Figure 7:
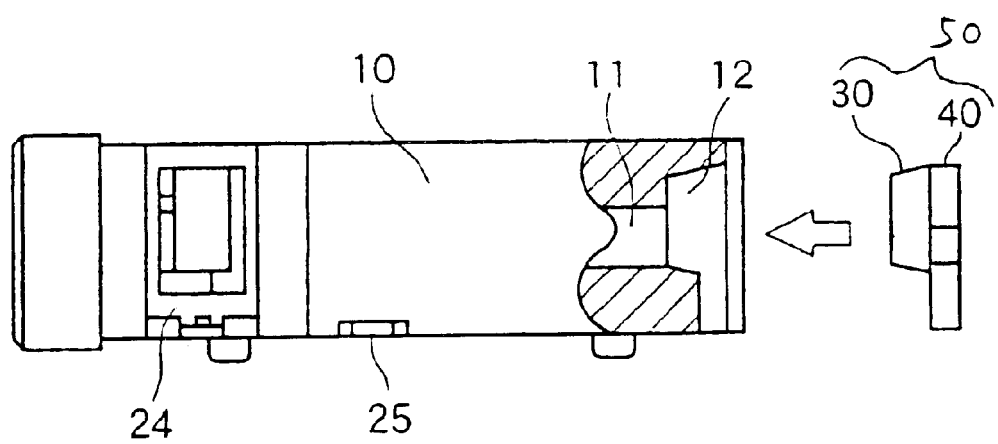
FIG. 7 is a partially-broken side view showing a direction that the optical device and the printed wiring board of the optical connector are inserted.

FIG. 5 is a plan view of optical connector relating to a second embodiment of the present invention. FIG. 6 is a partially-broken side view of the optical connector. FIG. 7 is a partially-broken side view showing a direction that the optical device and the printed wiring board of the optical connector are inserted.

The optical connector relating to the second embodiment of the present invention is different from the optical connector relating to the first embodiment of the present invention in a direction that the optical element 50 is inserted. Namely, in accordance with the optical connector relating to the second embodiment of the present invention, the device accommodating hole 12 into which the optical device 30 and the printed wiring board 40 are inserted is provided at a back end surface of the body 10, and the optical device 30 and the printed wiring board 40 are inserted into the device accommodating hole 12 from backward and then fixed. Consequently, the optical device 30 which is inserted into the device accommodating hole 12 is surrounded by the body 10, and the printed wiring board 40 is surrounded by the body 10 except for a lower end surface thereof.

Accordingly, also in accordance with the optical connector relating to the second embodiment of the present invention, it is possible to prevent a flux from attaching to the transparent resin package 31 of the optical device 30.

Figure 8:
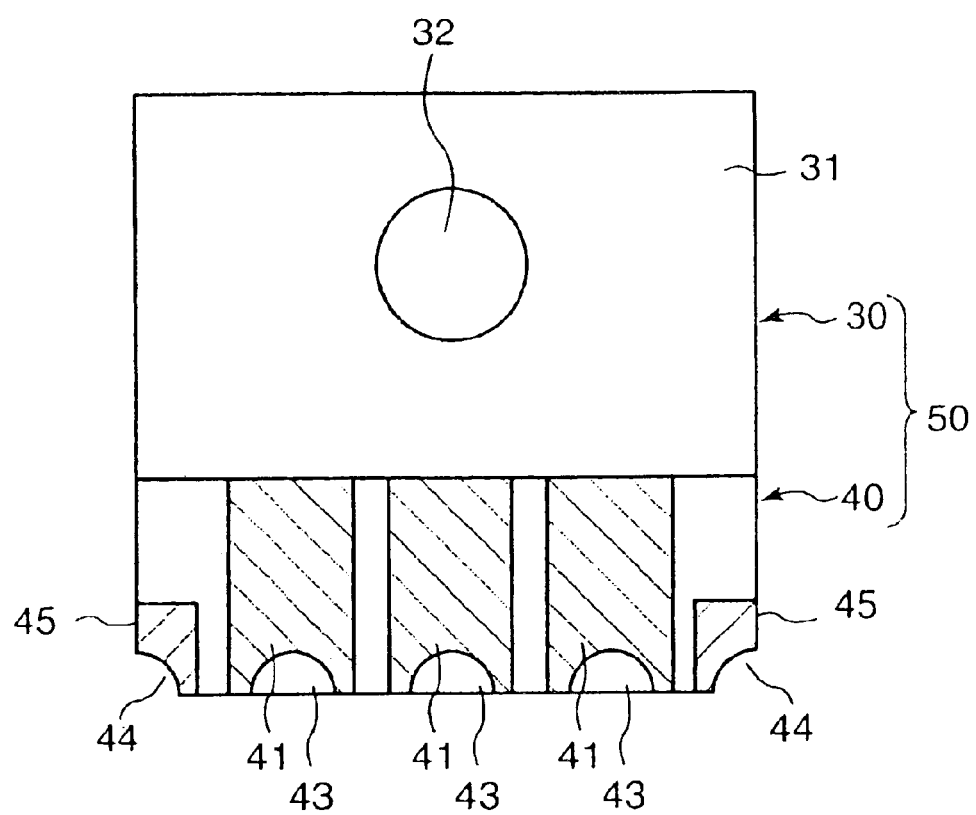
FIG. 8 is a front view of another optical element used for the optical connector of the present invention.
Figure 9:
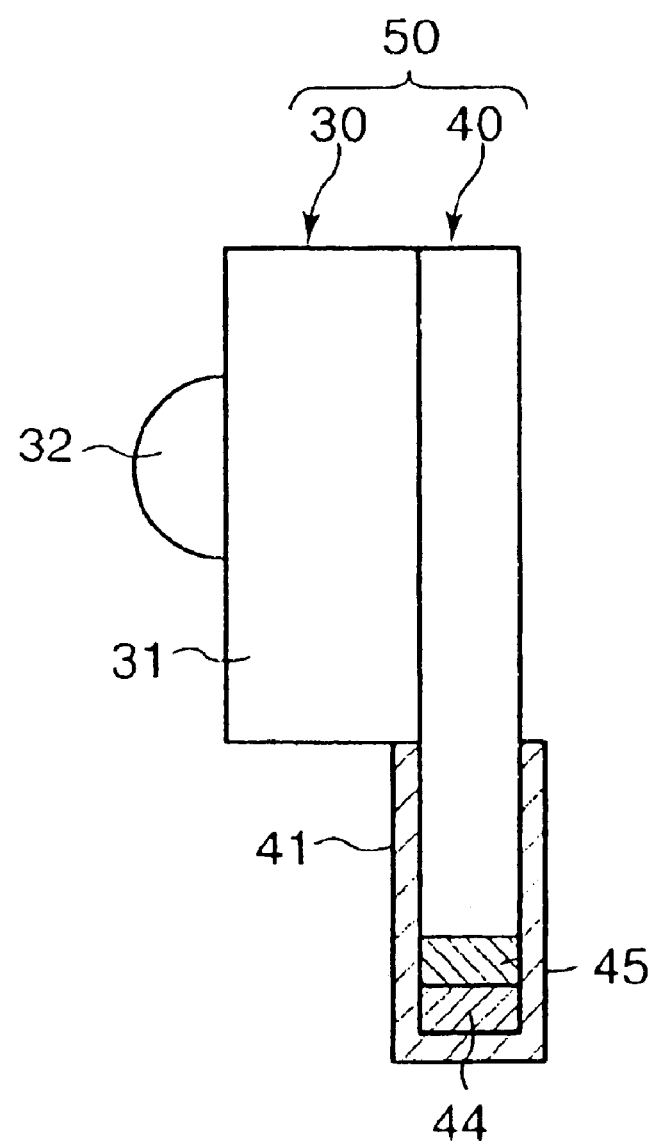
FIG. 9 is a side view of the optical element.
Figure 10:
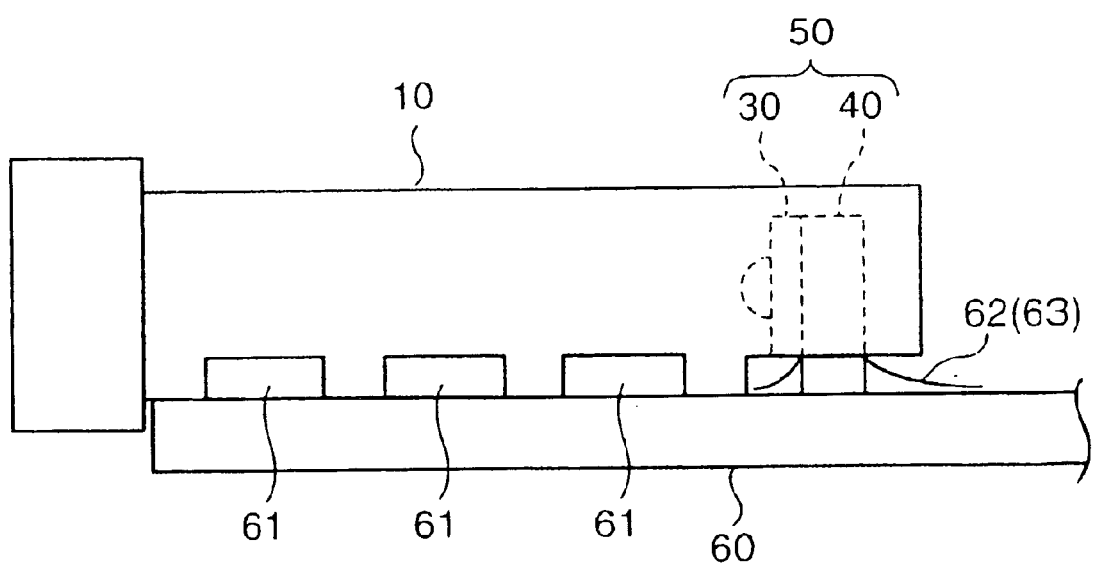
FIG. 10 is a side view showing a state of the optical connector with the optical element mounted thereto being mounted.
Figure 11:
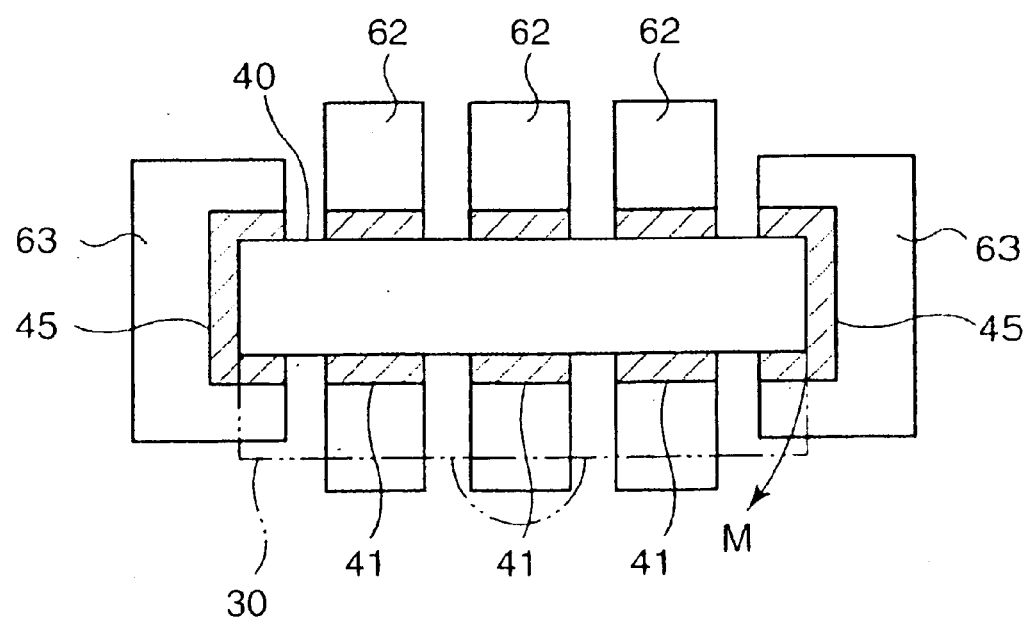
FIG. 11 is a plan view showing a state of the optical element being bonded.

FIG. 8 is a front view of another optical element used for the optical connector of the present invention. FIG. 9 is a side view of the optical element. FIG. 10 is a side view showing a state of the optical connector to which the optical element is mounted being mounted. FIG. 11 is a plan view showing a state of the optical element bonded. Referring to FIGS. 8 through 11 and 12 through 15 to be shown later, an area that a printed pattern is formed will be shown by hatchings for convenience of illustration.

As shown in FIGS. 8 and 9, the optical element 50 used herein is different from the optical element 50 used for the above-described optical connector in a structure of the printed wiring board 40, i.e., in that dummy patterns 45 and through-holes 44 are formed at opposite side edge portions of the lower end surface of the printed wiring board 40. Structures of other portions and a mechanism for mounting to the body 10 are substantially the same as in the optical element 50 used for the above-described optical connector.

The structure of the printed wiring board 40 will be specifically described. The transparent resin package 31 of the optical device 30 is mounted to a front surface of the printed wiring board 40 except for the lower portion thereof. A lens 32 is formed at a front surface of the transparent resin package 31 so as to oppose a distal end portion of plug inserted into the plug insertion hole 11 of the body 10. The lens 32 is placed at a front surface side of chip sealed within the transparent resin package 31.

A plurality of vertically-oriented wiring patterns 41 that are aligned in a substrate widthwise direction are printed on a lower front surface of the printed wiring board 40. The plurality of vertically-oriented wiring patterns 41 are printed extendedly via the lower end surface of the printed wiring board 40 to the lower rear surface of the printed wiring board 40. A plurality of first through-holes 43 corresponding to the wiring patterns 41 are formed at the lower end surface of the printed wiring board 40 except for the opposite side edge portions thereof. Each of the first through-holes 43 passes through the printed wiring board 40 in a plate thickness direction, and is a concave portion whose lower surface is open downward and cross-section is a semi-circular shape.

Second through-holes 44 each of which opens downward and toward lateral direction and whose cross-section is formed in a quarter of circle are provided at the opposite side edge portions of the lower end surface of the printed wiring board 40 so as to pass through the printed wiring board 40 in a plate thickness direction. The dummy pattern 45 is printed at an inner surface of the second through-hole 44. The dummy pattern 45 is extendedly formed at the front, rear and side surfaces of the printed wiring board 40.

The optical connector with which the above-described optical element 50 is equipped is mounted on the main substrate by, e.g., reflow soldering. In a mounted state, as shown in FIG. 10, the contact piece members are electrically connected to the surface of the main substrate 60 by soldered portions 61 and mechanically fixed thereto. As shown in FIG. 11, the wiring patterns 41 and the dummy patterns 45 of the printed wiring board 40 are bonded to the surface of the main substrate 60 by the soldered portions 62 and 63. By the wiring patterns 41 bonded by the soldered portions 62, the optical device 30 is electrically connected via the printed wiring board 40 to the main substrate 60 and the printed wiring board 40 is mechanically fixed to the main substrate 60. Also, by the dummy patterns 45 bonded by the soldered portions 63, the printed wiring board 40 is also mechanically fixed to the main substrate 60.

If additional dummy pattern 45 is bonded by the soldered portion 63, in addition that a soldered area is increased and a soldering strength is enhanced, high resistive force to rotational moment M within a plane parallel to the surface of the main substrate 60 is exhibited because the soldered portions 63 are positioned at the opposite side edge portions of the printed wiring board 40. For this reason, sufficient soldering strength for insertion/removal of the plug relative to the body 10 or for wrench of the plug inserted into the body 10 is ensured, and soldering strength of the printed wiring board 40 and mounting strength of the optical connector are improved.

Even if the optical connector is made compact in accordance with compactness of equipments, the total soldered area becomes larger than that of conventional optical connector, so that the mounting strength of the optical connector is improved.

Further, in accordance with the present embodiment, the first through-holes 43 and the second though-holes 44 are formed at the lower end surface of the printed wiring board 40 so as to correspond to the wiring patterns 41 and the dummy patterns 45. If such through-holes are formed, an interface distance is increased. In this regard, the soldering strength of the printed wiring board 40 is improved.

The wiring patterns 41 are formed at both the front surface and the rear surface of the printed wiring board 40. For this reason, the soldered portions 62 of the wiring patterns 41 are extendedly formed at the front surface and the rear surface of the printed wiring board 40. The dummy patterns 45 are formed at three surfaces, i.e., front, rear and side surfaces of the printed wiring board 40. Thus, the soldered portions 63 of the dummy patterns 45 are extendedly formed at the front, rear and side surfaces of the printed wiring board 40. As described above, in accordance with the present embodiment, the soldering strength of the printed wiring board 40 is improved in view of an increase in area of the soldered portions 62 and 63 due to the wiring patterns 41 and the dummy patterns 45 being extendedly formed.

Accordingly, in accordance with the present embodiment, the soldering strength of the printed wiring board 40 is extremely high.

Figure 12:
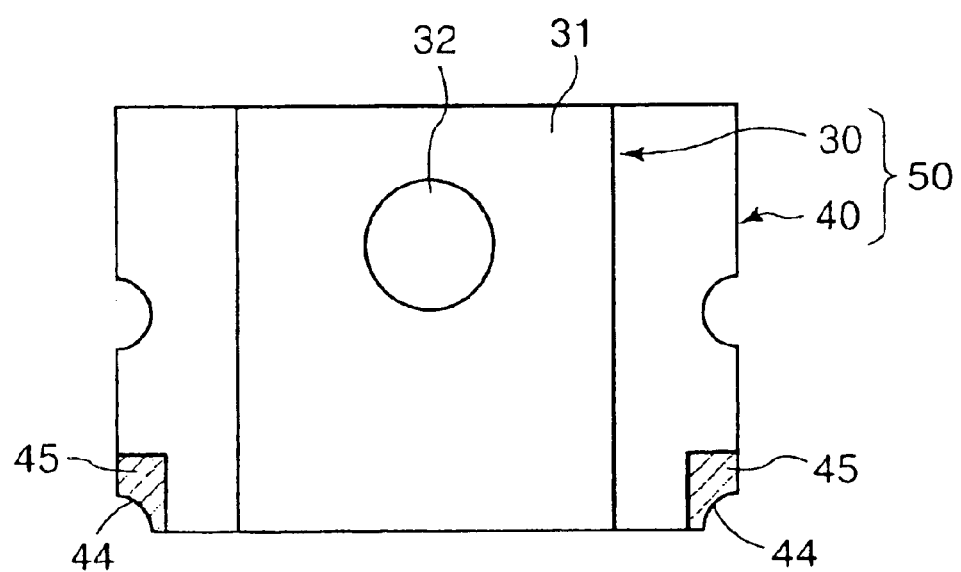
FIG. 12 is a front view of yet another optical element used for the optical connector of the present invention.
Figure 13:
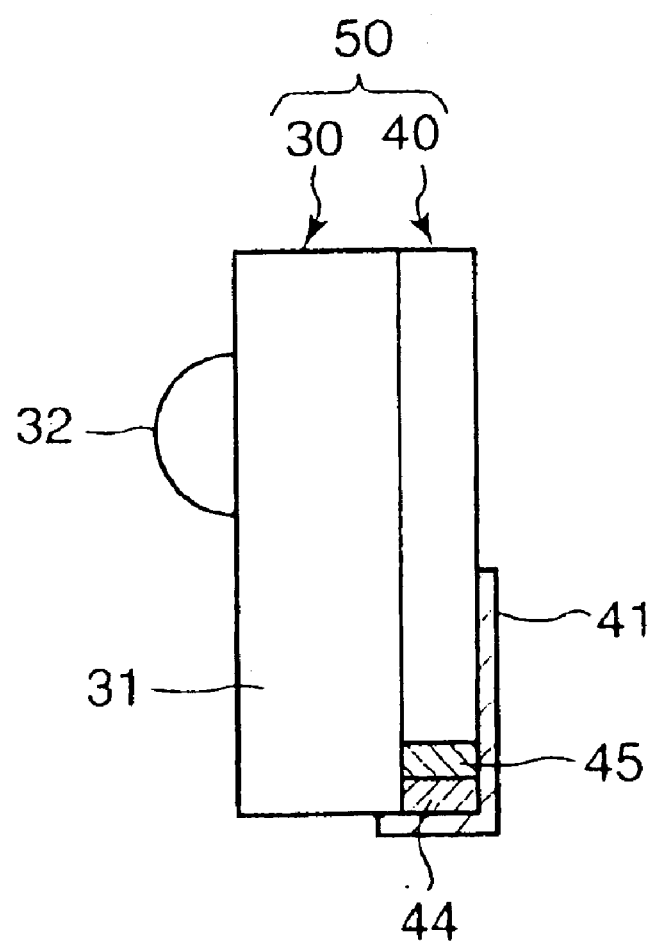
FIG. 13 is a side view of the optical element.
Figure 14:
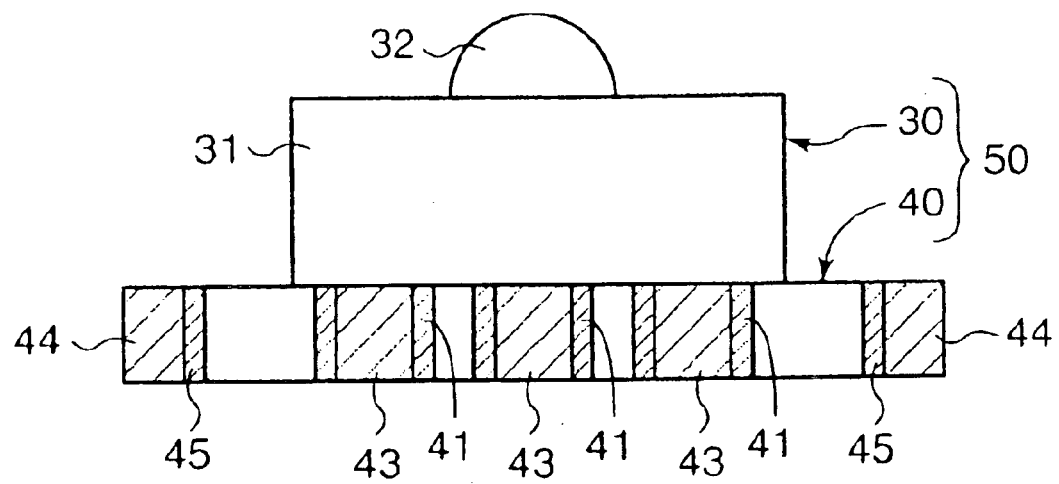
FIG. 14 is a bottom view of the optical element.
Figure 15:
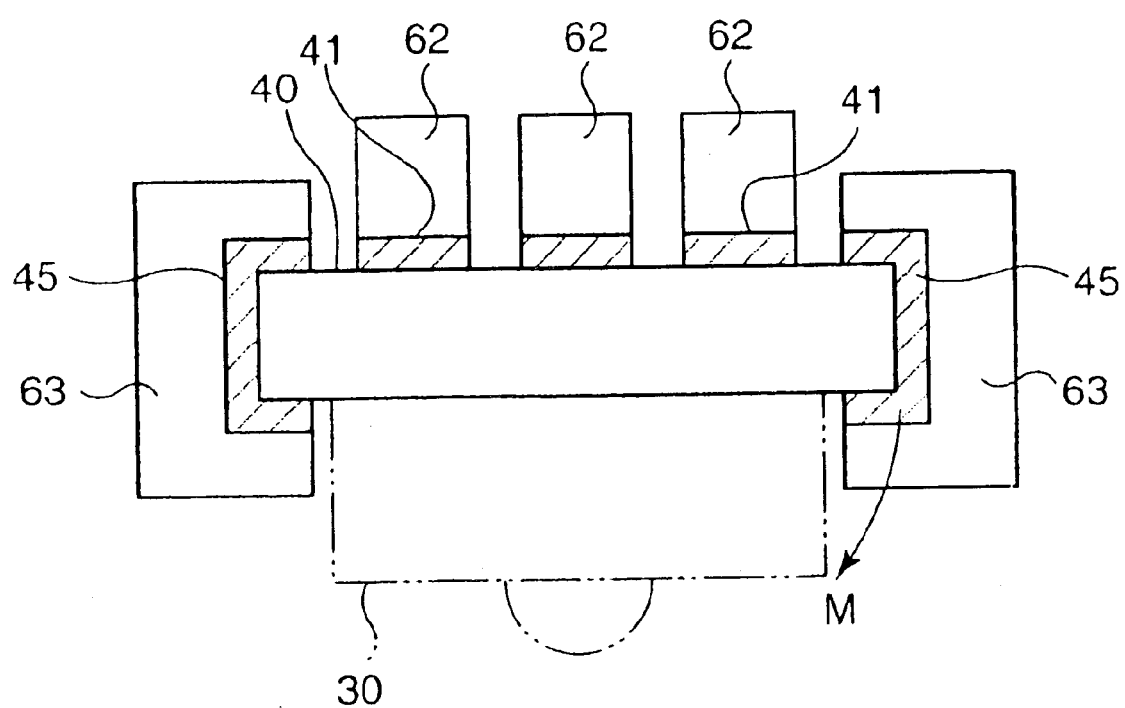
FIG. 15 is a plan view showing a state of the optical element being bonded.

FIG. 12 is a front view of yet another optical element used for the optical connector of the present invention. FIG. 13 is a side view of the optical element. FIG. 14 is a bottom view of the optical element. FIG. 15 is a plan view showing a bonded state of the optical element.

The optical element 50 used herein is different from the optical element 50 shown in FIGS. 8 through 11 in that the optical device 30 is bonded to a widthwise direction central portion of front surface of the printed wiring board 40. In accordance with such difference, the printed wirings 41 are formed at the lower end surface and the rear surface of the printed wiring board 40. Other structure is substantially the same as in the optical element 50 shown in FIGS. 8 through 11.

In the optical element 50 herein, the dummy patterns 45 and the through-holes 44 are additionally formed at the opposite side portions of the printed wiring board 40. Thus, the printed wiring board 40 exhibits high resistive force to the rotational moment M within a plane parallel to the surface of the main substrate 60 and sufficient soldering strength for insertion/removal of the plug relative to the body 10 or for wrench of the plug inserted into the body 10.

The first through-holes 42 and the second through-holes 44 are formed at the lower end surface of the printed wiring board 40 so as to correspond to the wiring patterns 41 and the dummy patterns 45. Further, the wiring patterns 41 are formed at the rear surface of the printed wiring board 40 and the soldered portions 62 thereof are extendedly formed at the printed wiring board 40. The dummy patterns 45 are formed at three surfaces, i.e., the front, rear and side surfaces, and the soldered portions 63 thereof are extendedly formed at the front, rear and side surfaces of the printed wiring board 40. As a result, the soldering strength of the printed wiring board 40 is improved.

As described above, in accordance with the optical connector of the present invention, the optical device is mounted on the printed wiring board and connected via the printed wiring board to the main substrate. Since a metallic lead frame is not used for the connection, crack or peeling does not occur at the transparent resin package of the optical device. Accordingly, soldering with high efficiency, high temperature and short time or reflow soldering is possible without increasing the number of steps such as baking, moisture-proof packaging and the like.

Further, in accordance with the optical element for the optical connector of the present invention, the optical device is mounted to the front surface of the printed wiring board disposed at an almost right angle within the body of the optical connector. The structure in which the wiring patterns provided at the lower end surface of the printed wiring board are soldered to the main substrate to which the optical connector is mounted is utilized. Thus, the soldering with high efficiency, high temperature and short time or the reflow soldering is possible without using the baking or the moisture-proof packaging, and the mounting area can be reduced.

In particularity, by providing the dummy patterns for mounting strength enhancement at the opposite side end portions of the lower end surface of the printed wiring board, soldering strength relative to insertion/removal of plug or wrench thereof can be significantly improved.

What is claimed is:

1. An optical connector comprising:
    a body having a hole extending substantially axially therethrough for insertion of a plug; and
    an opening in the body extending perpendicularly across said hole;
    an optical device for disposition within the hole at a side of a distal end of the plug inserted into the body,
    wherein said optical device is mounted to a surface of a printed wiring board which is placed in the hole within said body at a substantial right angle with respect to said surface, and connected via said printed wiring board to a main substrate to which the optical connector is mounted.

2. The optical connector according to claim 1, including a transparent resin package mounted on said printed wiring board, and wherein said printed wiring board is made of the same material as said transparent resin package of said optical device.

3. The optical connector according to claim 1 or 2, wherein mounting of said printed wiring board to the main substrate is performed by reflow soldering.

4. The optical connector according to claim 1 or 2, wherein said printed wiring board is inserted into said body from the rear surface side opposite to the side into which the plug is inserted, and fixed thereto.

5. The optical connector according to claim 1 or 2, wherein said printed wiring board is inserted into said body from the upper surface side opposite to the surface at which the optical connector is mounted, and fixed thereto.

6. The optical connector according to claim 4, wherein the optical device which is mounted to the surface of said printed wiring board is shielded by a part of said body at the side at which the optical connector is mounted.

7. An optical element which is mounted to a body of an optical connector into which a plug is inserted, comprising:
    a printed wiring board for placement within said body so as to make a substantial right angle with respect to said body, wiring patterns provided at a lower end surface of said printed wiring board such that said lower end surface thereof is soldered to a main substrate in a state of said optical connector being mounted to said main substrate; and an
    optical device mounted to a front surface of said printed wiring board to be disposed at the side of the distal end of said plug when said plug is inserted into said body.

8. The optical element for an optical connector according to claim 7, wherein said printed wiring board has said wiring patterns at a portion of the lower end surface other than opposite side end portions, and dummy patterns for mounting strength enhancement disposed at the opposite side end portions of said lower end surface.

9. The optical element for an optical connector according to claim 8, wherein said wiring patterns and said dummy patterns are continuously formed so as to be exposed from the lower end surface to at least one of the front surface and the rear surface.

10. The optical element for optical connector according to claim 8 or claim 9, wherein said printed wiring board has first through-holes which pass through the board in a plate thickness direction at positions corresponding to the wiring patterns of said lower end surface, and second through-holes which pass through the board in a plate thickness direction at positions corresponding to said dummy patterns.

11. The optical element for optical connector according to claim 10, wherein said through-hole is a concave portion with its cross-section being formed in a substantial semicircular shape, and said second through-hole is a concave portion with its cross-section being substantially a quarter of a circle and formed at an intersection of the lower end surface of said printed wiring board to the side surface thereof.

* * * * *

UNITED STATES PATENT AND TRADEMARK OFFICE
CERTIFICATE OF CORRECTION

PATENT NO. : 6,767,137 B2
DATED : July 27, 2004
INVENTOR(S) : Yoshiaki Ohbayashi et al.

Figure 16A:
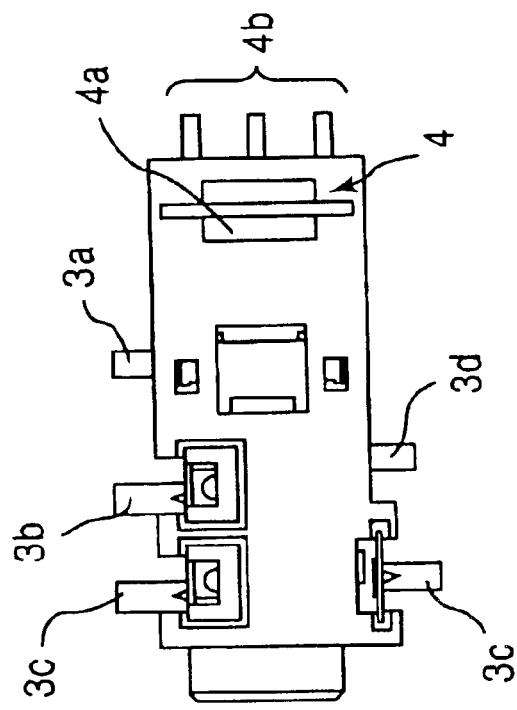
FIG. 16 shows three views of conventional optical connector.
Figure 16C:
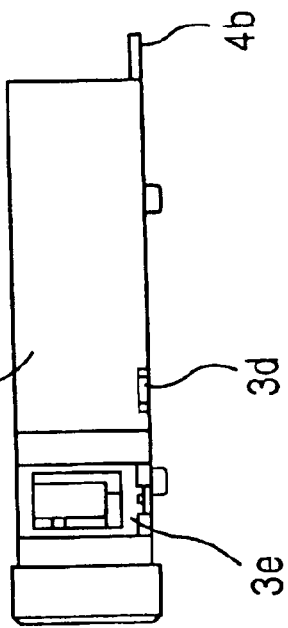
Figure 16B:
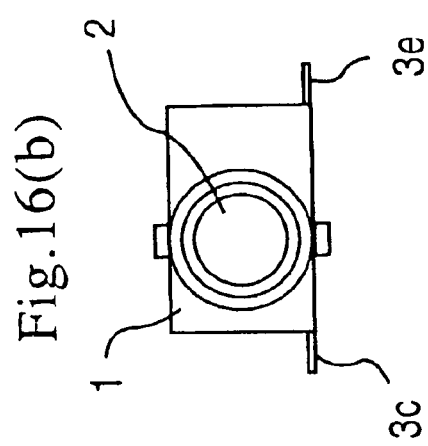

It is certified that error appears in the above-identified patent and that said Letters Patent is hereby corrected as shown below:

Column 4,
Beginning at line 14, replace the paragraph with the following paragraph:

-- Fig. 2 shows four views of optical device and printed wiring board used for the optical connector. FIG. 2(*a*) shows a plan view, FIG 2(*b*) shows a front view, FIG. 2(*c*) shows a side view and FIG. 2(*d*) shows a rear view. --
Beginning at line 46, replace the paragraph with the following paragraph:

-- FIG. 16 shows three views of conventional optical connector. FIG. 16(*a*) shows a plan view, FIG. 16(*b*) shows a front view and FIG. 16(*c*) shows a side view. --

Signed and Sealed this

Twenty-first Day of December, 2004

JON W. DUDAS
*Director of the United States Patent and Trademark Office*